United States Patent
Daigle et al.

(10) Patent No.: US 9,059,692 B2
(45) Date of Patent: Jun. 16, 2015

(54) RAIL TO RAIL COMPARATOR WITH WIDE HYSTERESIS AND MEMORY

(75) Inventors: Tyler Daigle, South Portland, ME (US); Julie Lynn Stultz, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 1047 days.

(21) Appl. No.: 13/149,399

(22) Filed: May 31, 2011

(65) Prior Publication Data

US 2012/0306477 A1 Dec. 6, 2012

(51) Int. Cl.
*G01R 19/00* (2006.01)
*H03K 5/24* (2006.01)

(52) U.S. Cl.
CPC ................................... *H03K 5/2481* (2013.01)

(58) Field of Classification Search
CPC .... H03F 3/193; H03F 3/45179; H03F 1/0277
USPC .............................................. 324/123, 76.11
See application file for complete search history.

(56) References Cited

U.S. PATENT DOCUMENTS

| | | | | |
|---|---|---|---|---|
| 3,932,797 | A * | 1/1976 | York | 320/136 |
| 5,744,990 | A * | 4/1998 | Burstein et al. | 327/143 |
| 6,157,222 | A * | 12/2000 | Yaklin | 327/81 |
| 8,542,222 | B2 * | 9/2013 | Nishimura et al. | 345/204 |
| 2009/0146499 | A1 * | 6/2009 | Takeda et al. | 307/80 |
| 2010/0289531 | A1 * | 11/2010 | Sudjian | 327/65 |
| 2011/0199360 | A1 * | 8/2011 | Fujiwara | 345/211 |
| 2013/0002355 | A1 * | 1/2013 | Toda et al. | 330/257 |

FOREIGN PATENT DOCUMENTS

| | | |
|---|---|---|
| CN | 101093983 A | 12/2007 |
| CN | 101675587 A | 3/2010 |
| CN | 101908868 A | 12/2010 |
| CN | 101989841 A | 3/2011 |
| CN | 102843119 A | 12/2012 |
| CN | 202978865 U | 6/2013 |

OTHER PUBLICATIONS

Lo et al., Actual capacitance function of nematic liquid crystal cell, Jap. Jour. of App. Physics, vol. 45, No. 2A, 2006, p. 891-895.*

(Continued)

*Primary Examiner* — Thomas F Valone
(74) *Attorney, Agent, or Firm* — Schwegman Lundberg & Woessner, P.A.

(57) ABSTRACT

An apparatus comprises an input to receive a voltage, a threshold voltage circuit, a comparison circuit, and an output. The threshold voltage circuit provides an adjustable first threshold voltage at a first output and an adjustable second threshold voltage at a second output. The comparison circuit determines when the input voltage is greater than the first voltage threshold, including when the first voltage threshold is adjusted substantially up to a high supply voltage rail, and determines when the input voltage is less than the second voltage threshold, including when the second voltage threshold is adjusted substantially down to a low supply voltage rail. The output provides a first indication when the input voltage is greater than the first voltage threshold and to provide a second indication when the input voltage is less than the second voltage threshold.

18 Claims, 9 Drawing Sheets

(56) References Cited

OTHER PUBLICATIONS

"Chinese Application Serial No. 201210166510.7, Office Action mailed Jul. 23, 2014", 12 pgs.
"Chinese Application Serial No. 201220240448.7, Office Action mailed Nov. 16, 2012", 14 pgs.
"Chinese Application Serial No. 201220240448.7, Response filed Jan. 10, 2013 to Office Action mailed Nov. 16, 2012", 20 pgs.
"Chinese Application Serial No. 201210166510.7 Response filed Nov. 25, 2014 to Non Final Office Action mailed Jul. 23, 2014", With English Claims., 9 Pages.

* cited by examiner

RAIL TO RAIL COMPARATOR WITH WIDE HYSTERESIS AND MEMORY

BACKGROUND

Electronic circuits and systems often include a comparison circuit. An example of a comparison circuit is comparator. A comparator is used to compare two voltages at inputs to the circuit. The output of a comparator changes state based on the comparison; typically to indicate which voltage is larger. Comparators are useful to detect an event using an electronic circuit. The performance of a comparator can be limited by the operating parameters of devices that make up the comparator. For example, transistors internal to a comparator can prevent the comparator from operating from the low voltage supply to the high voltage supply (e.g., rail-to-rail) due to operating limitations of the transistors.

OVERVIEW

This document relates generally to electronic circuits, and in particular, to a comparator circuit that is operable rail-to-rail.

An apparatus example includes an input to receive a voltage, a threshold voltage circuit, a comparison circuit, and an output. The threshold voltage circuit provides an adjustable first threshold voltage at a first output and an adjustable second threshold voltage at a second output. The comparison circuit determines when the input voltage is greater than the first voltage threshold, including when the first voltage threshold is adjusted substantially up to a high supply voltage rail, and determines when the input voltage is less than the second voltage threshold, including when the second voltage threshold is adjusted substantially down to a low supply voltage rail. The output provides a first indication when the input voltage is greater than the first voltage threshold and to provide a second indication when the input voltage is less than the second voltage threshold.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A comparison circuit can be used to compare a received or generated electrical signal to a specified threshold voltage value. The output of the comparison circuit indicates the result of the comparison. Some comparison circuits, such as comparators, are not able to operate rail-to-rail. If the comparator is N-type (e.g., the input differential pair of the comparator includes N-Type Metal Oxide Semiconductor (NMOS) devices), the comparator may not operate to voltages close to the low voltage supply rail. Similarly, if the comparator is P-type, the comparator may not operate to voltages close to the high voltage supply rail.

Figure 1:
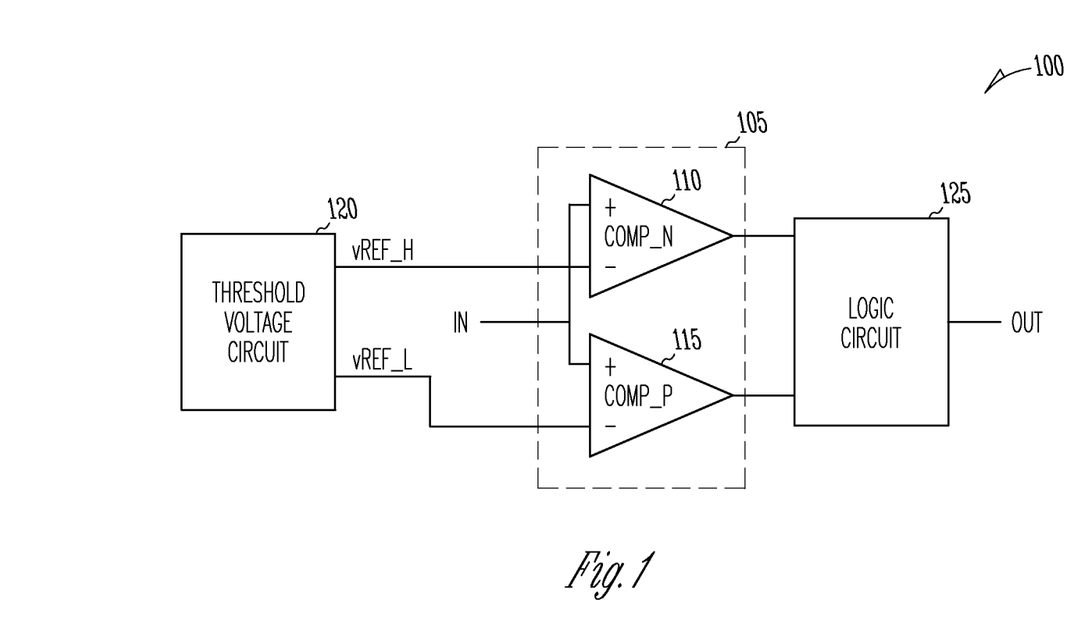
FIG. 1 shows a block diagram of portions of an example of an electronic circuit that includes a comparison circuit that operates from rail-to-rail.

FIG. 1 shows a block diagram of portions of an example of an electronic circuit 100 that includes a comparison circuit 105 that operates from rail-to-rail. The comparison circuit 105 includes a first comparator 110 and a second comparator 115. The first comparator 110 is an N-type comparator that operates to detect a range of input voltages that extends from a voltage somewhat less than the midpoint between the high and low voltage rails to the voltage of the high voltage supply rail. The second comparator 115 is a P-type comparator that operates to detect a range of input voltages that extends from a voltage somewhat greater than the midpoint between the high and low voltage rails to the voltage of the low voltage supply rail. The combination results in a comparison circuit that operates rail-to-rail.

Figure 2:
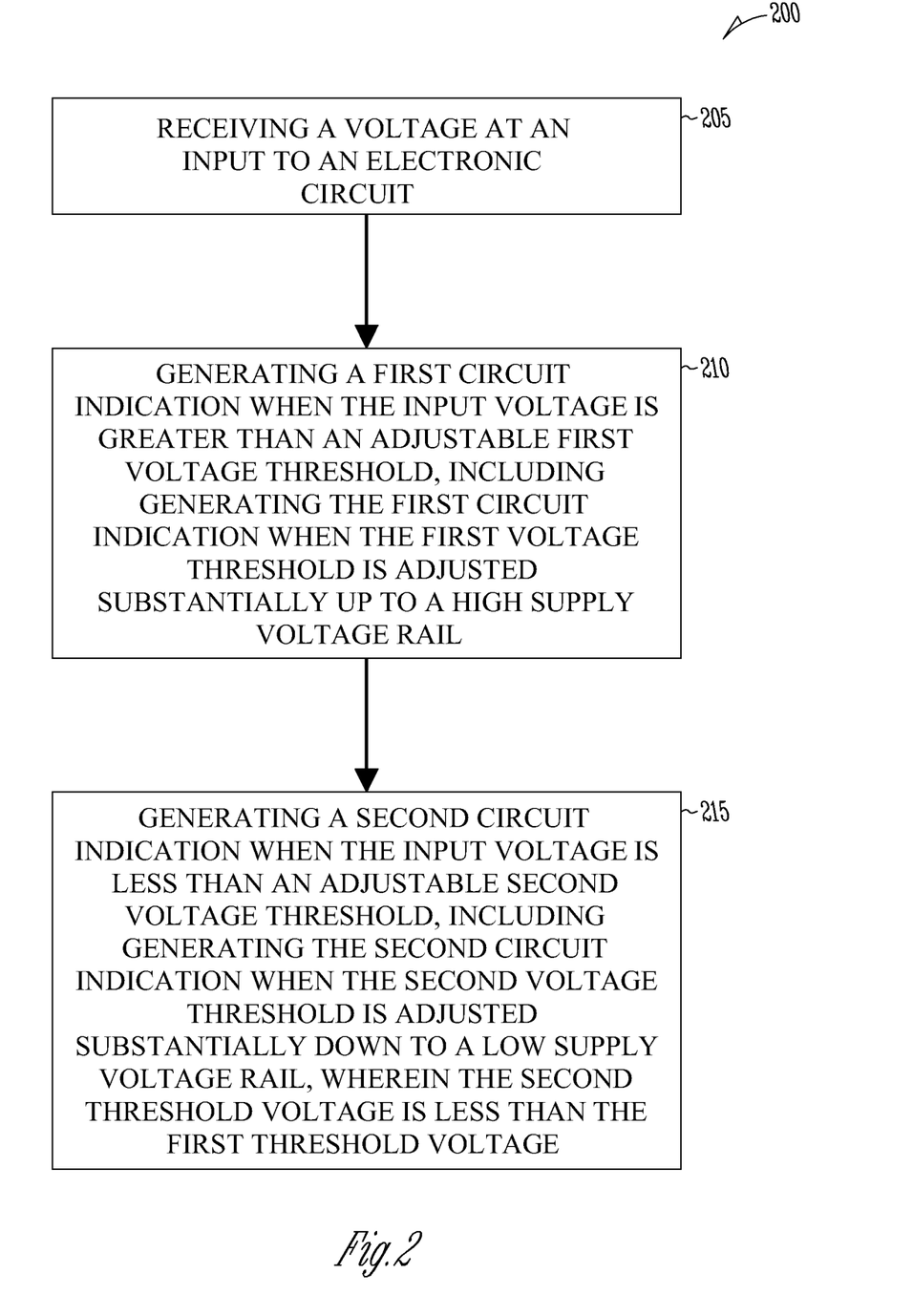
FIG. 2 shows an example of a method of operating an electronic circuit capable of comparing voltages from rail-to-rail.

FIG. 2 shows an example of a method 200 of operating an electronic circuit capable of comparing voltages from rail-to-rail. At block 205, a voltage is received at an input to an electronic circuit.

At block 210, a first circuit indication is generated when the input voltage is greater than an adjustable first voltage threshold. In some examples, the first voltage threshold is programmable. A circuit indication can be a change in state of an output of a comparison circuit. The first circuit indication can be generated when the first voltage threshold is adjusted substantially up to a high supply voltage rail of the electronic circuit.

At block 215, a second circuit indication is generated when the input voltage is less than an adjustable second voltage threshold. The second circuit indication can be generated when the second voltage threshold is adjusted substantially down to a low supply voltage rail.

If the second threshold voltage is less than the first threshold voltage, then the electronic circuit can provide hysteresis in the circuit indications. For instance, when the input voltage first exceeds the first voltage threshold, this causes the first indication to be present at an output of the electronic circuit. The first indication can remain at the output when the input voltage decreases back to the first threshold voltage. The first indication can remain at the circuit output until the input voltage decreases to a voltage less than the second threshold voltage, at which point the second indication can be generated at the circuit output.

Returning to FIG. 1, the electronic circuit 100 includes an input (In) to receive a voltage and includes a threshold voltage circuit 120. The threshold voltage circuit 120 is configured to provide an adjustable first threshold voltage at a first output (vREF_H) and an adjustable second threshold voltage at a second output (vREF_L).

In some examples, the threshold voltage circuit 120 includes a voltage divider circuit. The voltage divider circuit divides a reference voltage to generate the first and second threshold voltages. In certain examples, a bandgap voltage reference circuit is used to provide a reference voltage that is relatively immune to variation with process and temperature variation. In some examples, the threshold voltage circuit 120 is configured to provide one or more programmable threshold voltages. In some examples, the second threshold voltage is less than the first threshold voltage to provide hysteresis in its voltage detection.

The comparison circuit 105 is communicatively coupled to the input and the threshold voltage circuit. The communicative coupling allows electrical signals from the input and the threshold voltage circuit 120 to be received by the comparison circuit 105 even though there may be intervening circuitry between them.

The comparison circuit 105 is configured to determine when the input voltage is greater than the first voltage threshold, including the case where the first voltage threshold is adjusted up to, or substantially up to, the high supply voltage rail. The comparison circuit 105 is also configured to determine when the input voltage is less than the second voltage threshold, including the case where the second voltage threshold is adjusted down to, or substantially down to, a low supply voltage rail.

An output (Out) of the circuit 100 provides a first indication when the input voltage is greater than the first voltage threshold and provides a second indication when the input voltage is less than the second voltage threshold. In some examples, the first and second indications include a change of binary logic state. In certain examples, a logic state of the output changes from a low state to a high state as the first indication when the input voltage is greater than the first voltage threshold, and the output changes from a high state to a low state as the second indication when the input voltage is less than the second voltage threshold.

Figure 3:
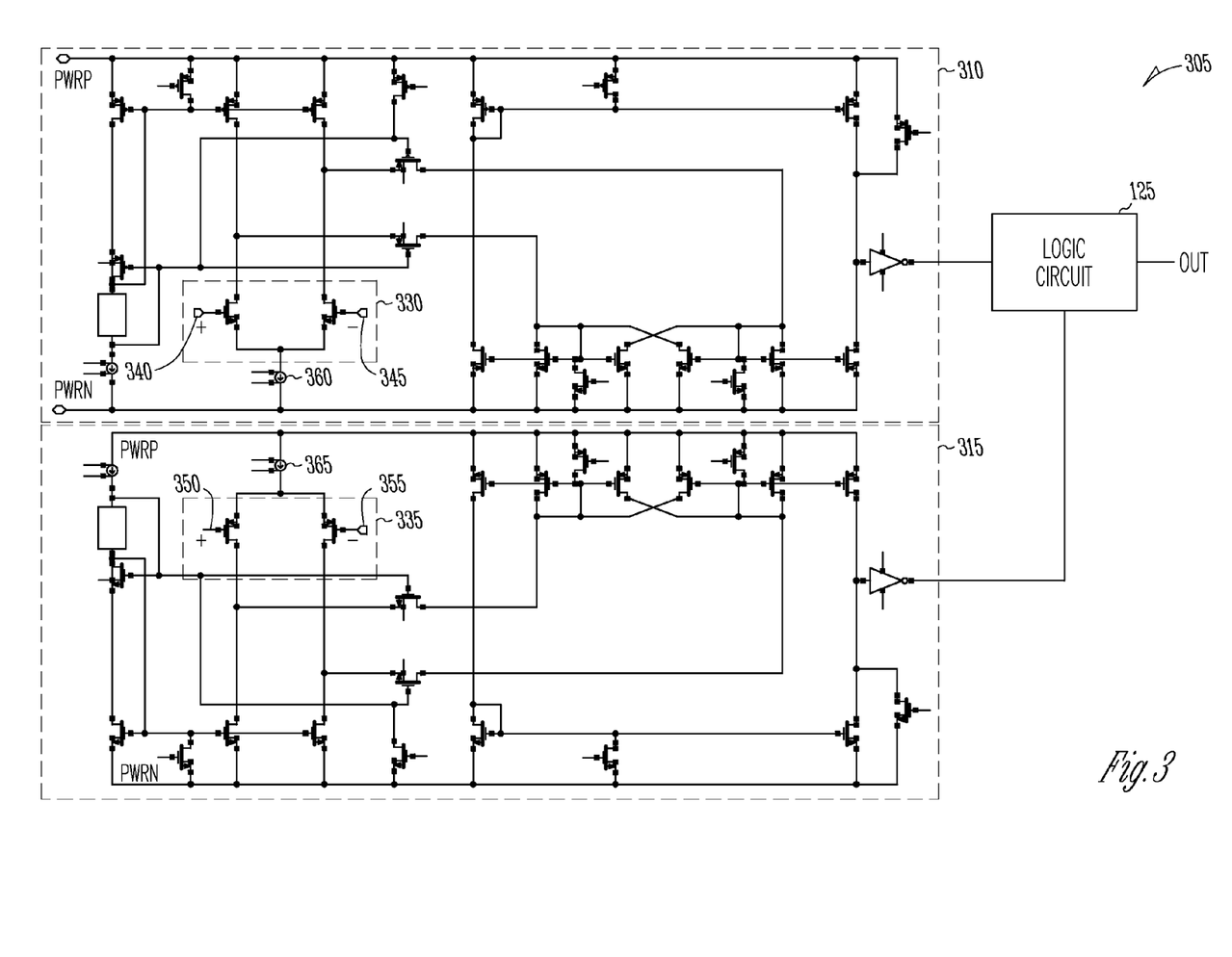
FIG. 3 shows another example of a comparison circuit that operates from rail-to-rail.

FIG. 3 shows another example of a comparison circuit 305 that operates from rail-to-rail. The comparison circuit 305 includes a first comparator 310 and a second comparator 315.

The first comparator 310 can be N-Type and can include a differential amplifier having a matched NMOS differential transistor pair 330, and the second comparator 315 can be P-Type and can include a differential amplifier having a matched PMOS differential transistor pair. The first and second comparators may have a fold cascode circuit topology.

The first comparator 310 includes a first comparator input 340 and a second comparator input 345, and the second comparator 315 also includes a first comparator input 350 and a second comparator input 355. The fold cascode topology allows the comparators to function with comparator inputs that reach the voltage supply rails.

The first inputs (340, 350) can be communicatively coupled to the input (In) in FIG. 1. The second inputs (345, 355) can be communicatively coupled to the outputs (vREF_H, vREF_L) of the threshold voltage circuit 120 of FIG. 1. Thus, the output of the first comparator will toggle low to high when the voltage at "In" increases above the first specified threshold voltage, and the second comparator will toggle high to low when the voltage at "In" decreases below the second specified threshold voltage.

The circuit of FIG. 1 also includes a logic circuit 125 communicatively coupled to the comparison circuit 105 and the output (Out). The logic circuit 125 is configured to provide a first logic state at the output as the first indication described previously, and to provide a second logic state as the second indication. The logic circuit 125 logically combines the outputs of the individual comparators with the result that the output behaves as one comparator with hysteresis even though each individual comparator does not provide hysteresis in its switching.

As long as each individual comparator's threshold voltage is set within its operating range (e.g., the low voltage supply rail plus 900 millivolts (mV) for the N-Type comparator, and the high supply rail minus 900 mV for the P-Type comparator), then the circuit of FIG. 1 as a whole is guaranteed functionality from rail to rail.

The comparison circuit 305 could be implemented with both of the comparators being of the same type (e.g., both having a matched N-Type differential pair, or both having a matched P-type differential pair) if desired. In this condition, the comparator will not operate from rail to rail, but if rail-to-rail is not needed, it may be easier for layout purposes to use comparators of the same type for each threshold voltage.

Figure 4:
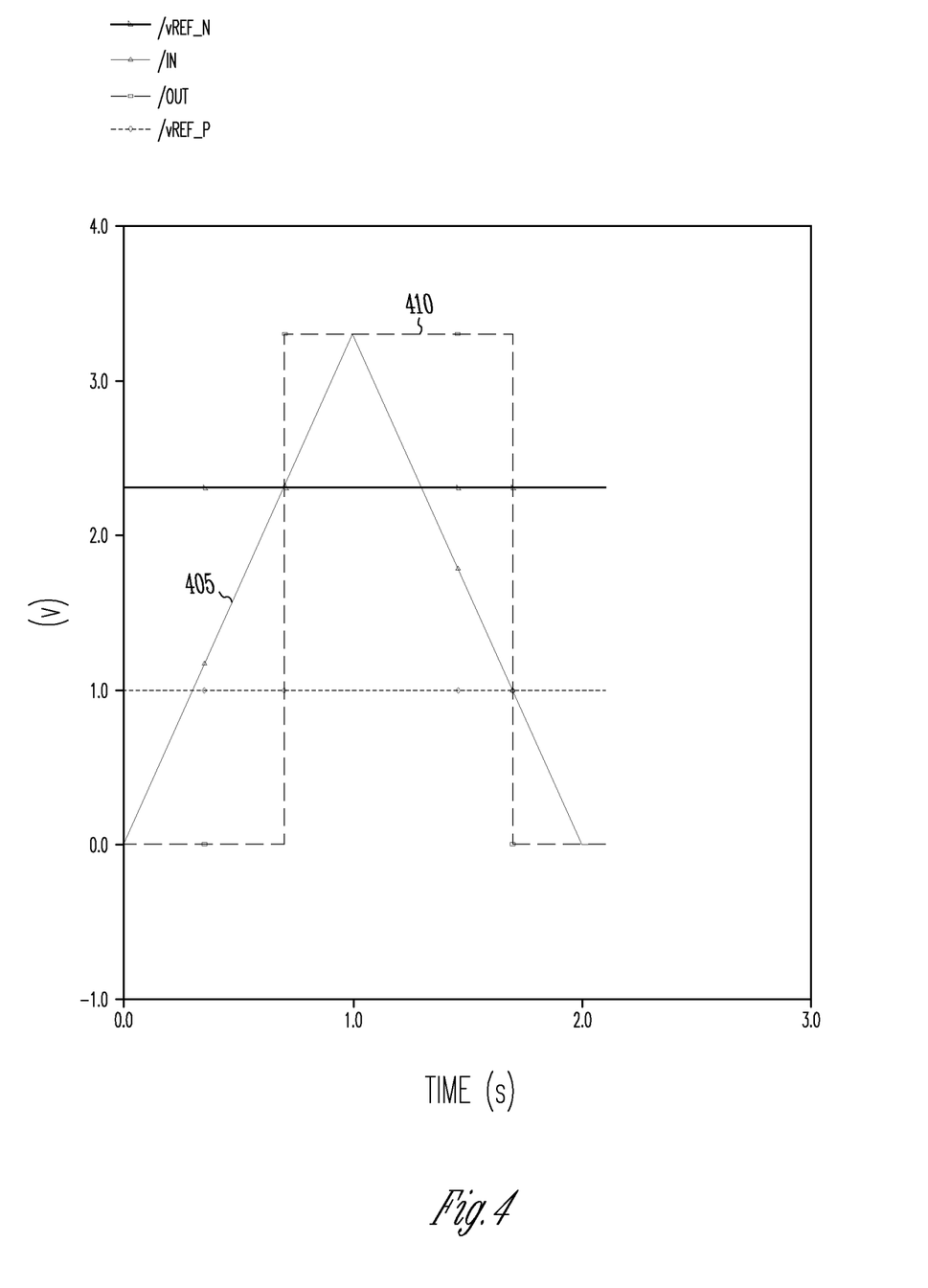
FIG. 4 shows an example of simulation of the circuit in FIG. 1.

FIG. 4 shows an example of simulation of the circuit in FIG. 1. The low supply rail is zero volts (0.0V) and the high supply rail is 3.3V. The first threshold voltage is set to 2.3V. Voltage at the input 405 is ramped up from 0.0V to 3.3V, and then ramped down from 3.3V to 0.0V. When the input reaches the first threshold of 2.3V, the output 410 changes to a high logic state to indicate that the input is greater than the first threshold voltage. When the input decreases to 1.0V, the output changes to a low logic state to indicate that the input is less than the second threshold voltage.

Figure 5:
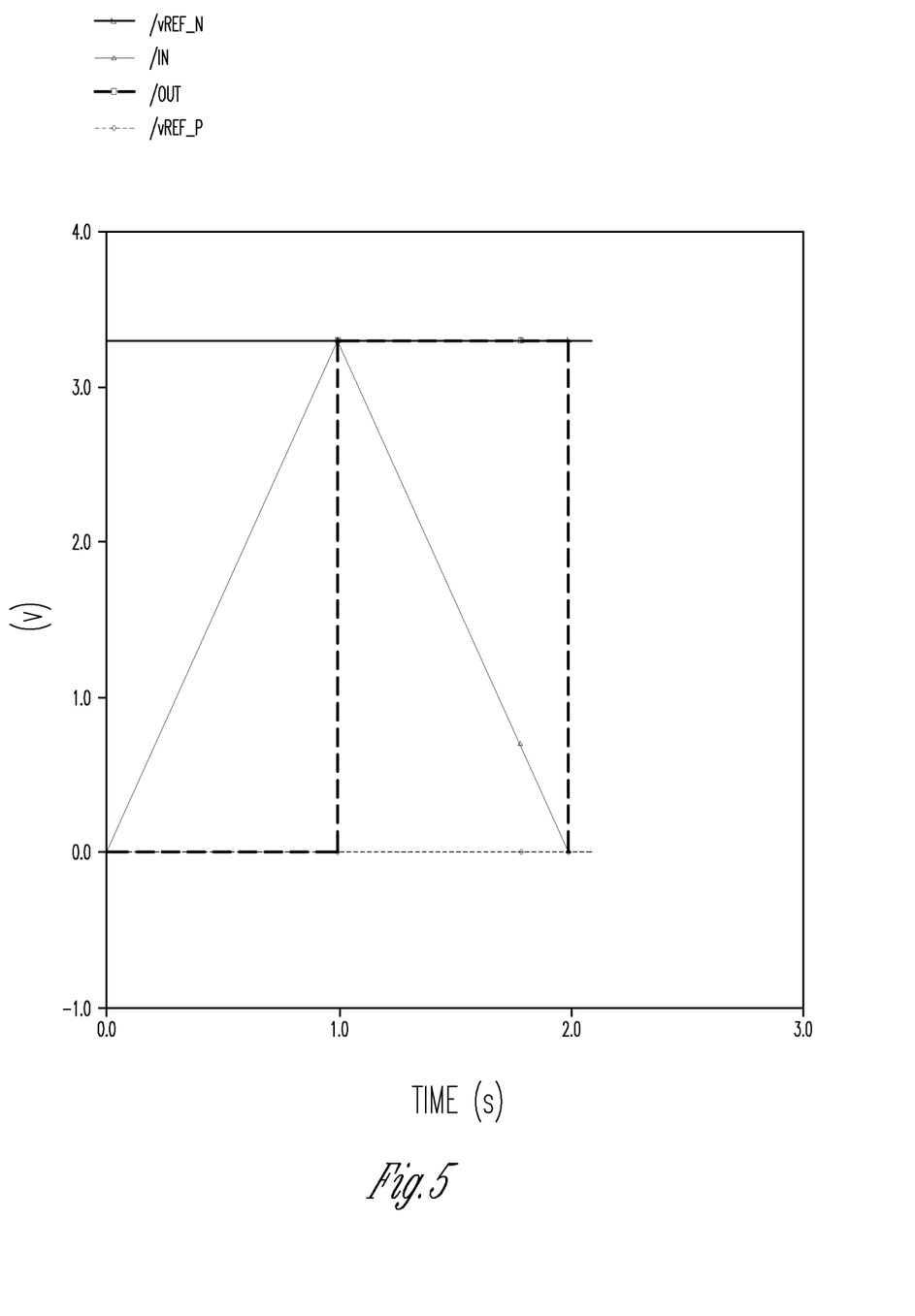
FIG. 5 shows another example of simulation of the circuit of FIG. 1.

FIG. 5 shows another example of simulation of the circuit of FIG. 1. In this example, the first threshold voltage is set to 3.3V minus 1 mV, and the second threshold voltage is set to 1 mV. The simulation shows that the circuit of FIG. 1 can operate rail-to-rail.

Returning to FIG. 1, the logic circuit 125 is further configured to maintain a logic state of the output when a disable input of the comparison circuit 105 is activated. In this way, the circuit 100 provides memory for the state of the output even though the comparison circuit 105 is disabled. In some examples, as in the comparators of FIG. 3, the comparison circuit 305 is disabled by turning off the current sink 360 and current source 365 of the comparators.

Figure 6:
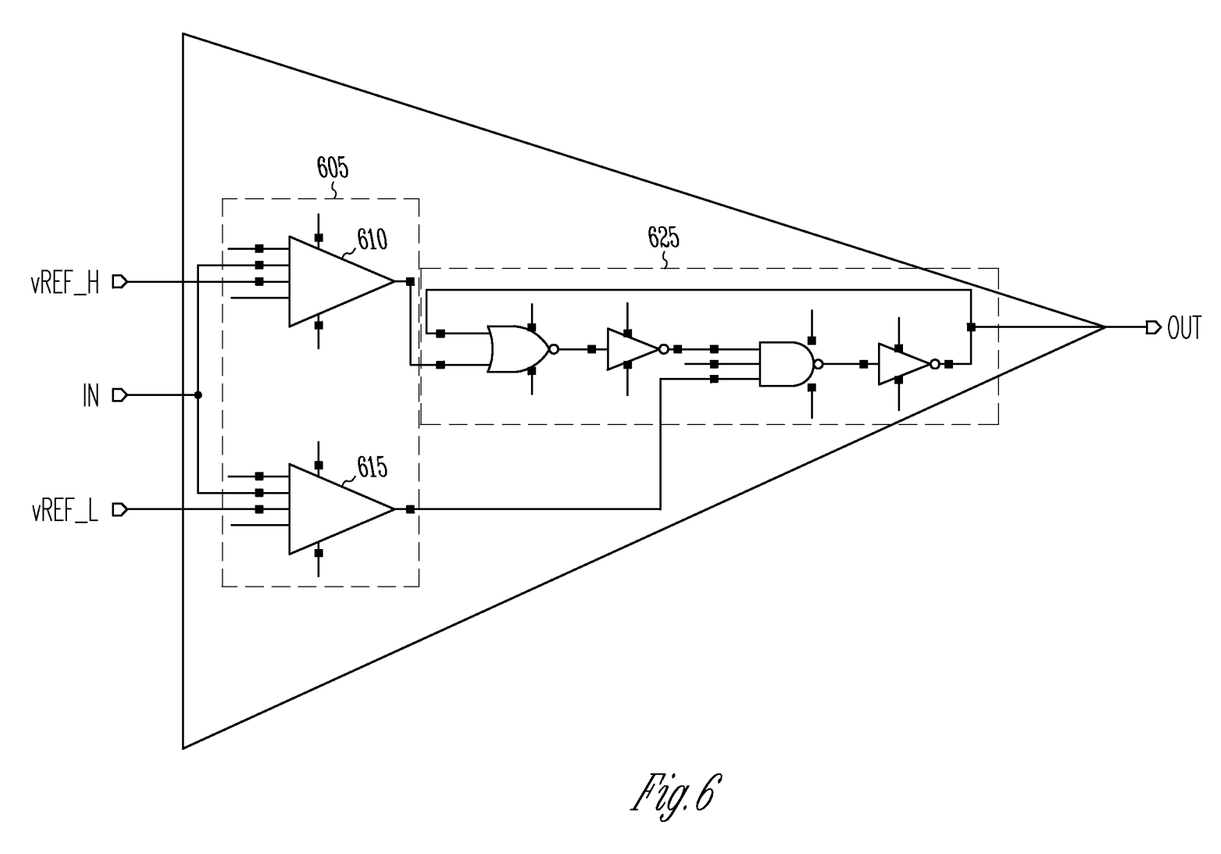
FIG. 6 shows a circuit schematic of an example of a logic circuit and a comparison circuit.

FIG. 6 shows a circuit schematic of an example of a logic circuit 625 and comparison circuit 605. The comparison circuit 605 includes an N-Type comparator 610 and a P-Type comparator 615. The logic circuit 625 includes a latch circuit configured to store the logic state of the output when the disable input of the comparison circuit is activated.

The comparison circuit 605 includes a first comparator 610 and a second comparator 615. Each comparator has an output coupled to the logic circuit 625. The output of the first comparator 610 is disabled to a first binary logic state and the output of the second comparator 615 is disabled to a second binary logic state when the disable input of the comparison circuit is activated. In some examples, the N-Type comparator 610 disables to a low state at its output, and the P-Type comparator 615 disables to a high state at its output. The logic state of the output of the logic circuit 625 can be stored when the first and second comparators are disabled. In some examples, the logic circuit 625 includes a power on reset input (POR), and the output of the logic circuit 625 is set to a specified logic state when the power on reset input is activated.

Figure 7A:
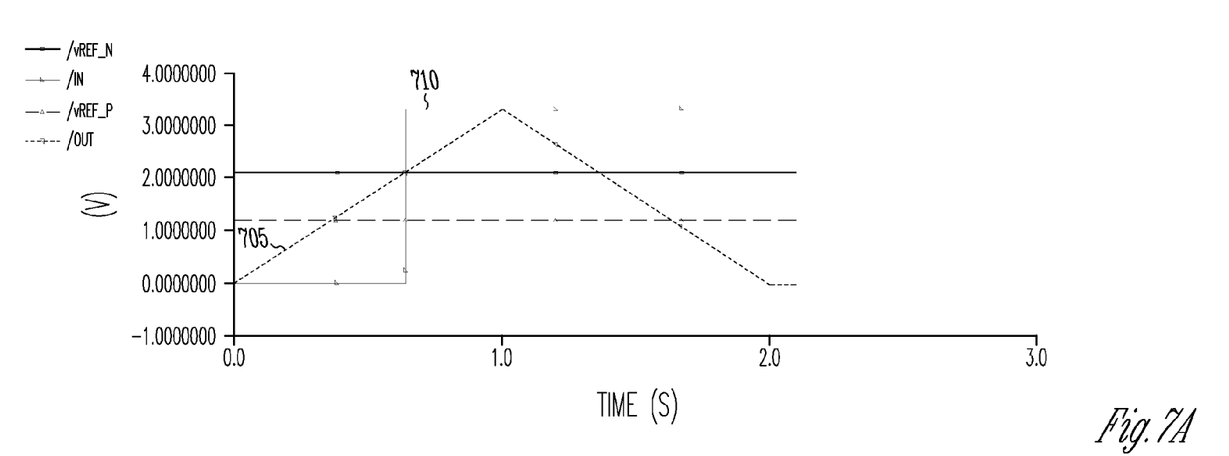
FIGS. 7A-7C show an example of simulation of the comparison circuit and the logic circuit of FIG. 6.
Figure 7B:
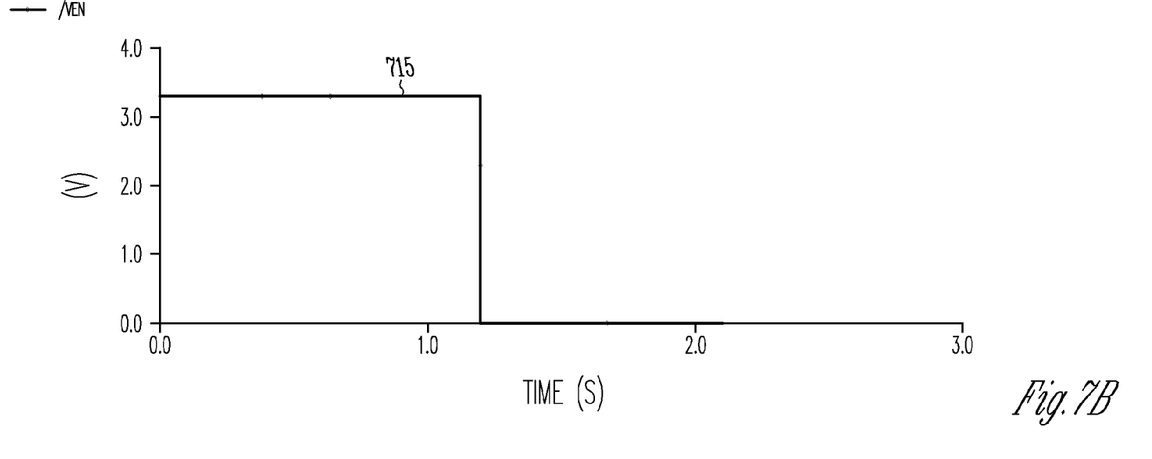
Figure 7C:
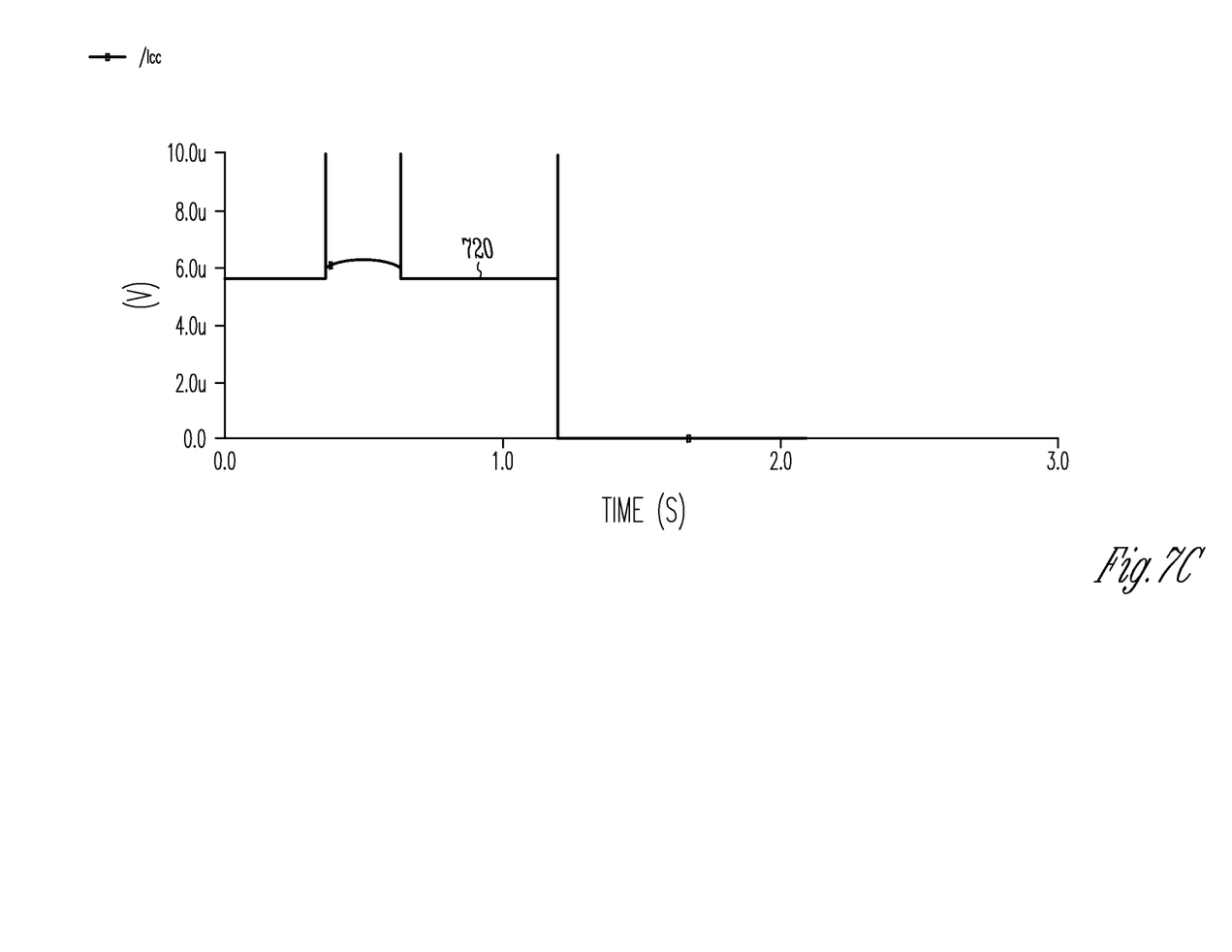

FIGS. 7A-7C show an example of simulation of the comparison circuit 605 and the logic circuit 625. The waveform 715 in FIG. 7B is an enable signal. The circuits are disabled when the enable is low (e.g., 0.0V). The waveforms in FIG. 7A show that the input voltage 705 is ramped up from 0.0V to 3.3V, and then ramped down from 3.3V to 0.0V. The first threshold voltage value is 2.1V and the second threshold voltage value is 1.2V. The simulation shows that the circuit output changes state from low to high when the input voltage is greater than the first threshold voltage value.

The simulation also shows that the enable is deactivated after the circuit output changes state from low to high. The input voltage 705 is then ramped down. The circuit output does not change state even though the input is less than the second voltage threshold. Thus, the logic state of the output at the time of disable is stored. The waveform 720 in FIG. 7C represents the current consumption of the circuit. The waveform 720 shows that the output state is stored and remains high even though current consumption of the circuit drops to zero.

Figure 8:
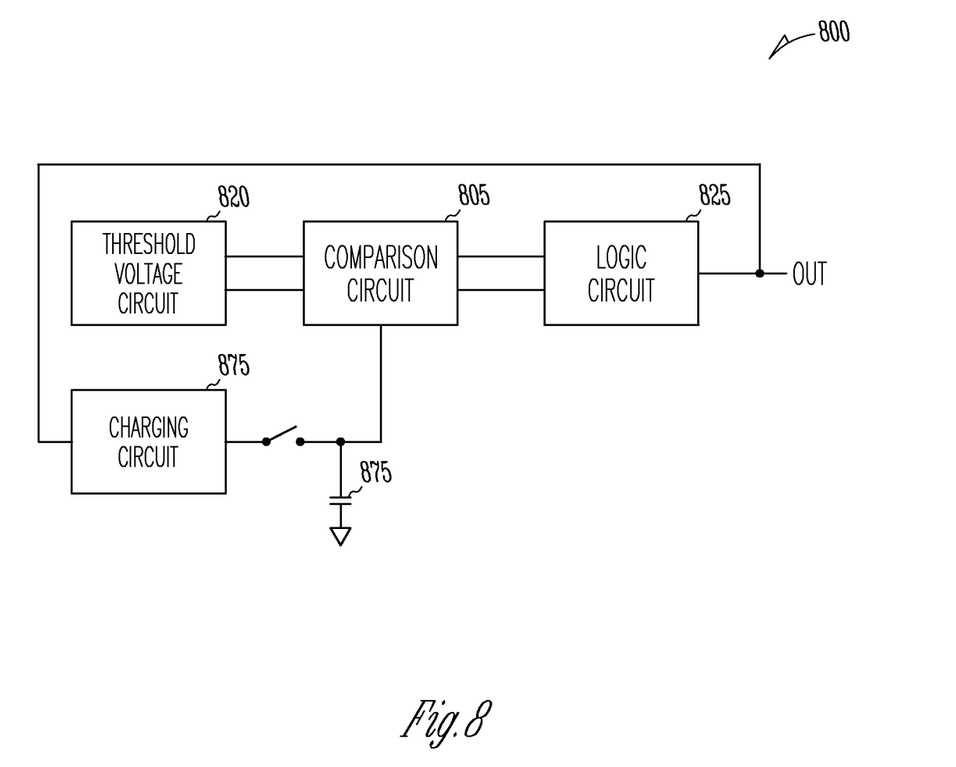
FIG. 8 shows an example of an electronic device that includes a comparison circuit with rail-to-rail operation.

FIG. 8 shows an example of an electronic device 800 that includes a comparison circuit with rail-to-rail operation. The device includes a comparison circuit 805, a threshold voltage circuit 820, and a capacitor 870. The threshold voltage circuit 820 provides first and second adjustable threshold voltages. The comparison circuit 805 monitors the voltage of the capacitor 870.

The comparison circuit 805 is configured to determine when a voltage of the capacitor is greater than the first voltage threshold, including the case where first voltage threshold is adjusted substantially up to a high supply voltage rail. The comparison circuit 805 is also configured to determine when the capacitor voltage is less than the second voltage threshold, including the case where the second voltage threshold is adjusted substantially down to a low supply voltage rail.

In some examples, the device 800 includes a logic circuit 825 is communicatively coupled to the comparison circuit and a device output. The logic circuit 825 provides, as the first indication, a first logic state at the output when the capacitor voltage is greater than the first voltage threshold, and provides, as the second indication, a second logic state at the output when the capacitor voltage is less than the second voltage threshold.

In some examples, the device 800 includes a capacitor charging circuit 875 communicatively coupled to the logic circuit 825. The first and second indications can be used to control charging of the capacitor 870. The capacitor charging circuit 875 may initiate charging of the capacitor 870 when the output transitions to the second logic state and disable charging of the capacitor 870 when the output transitions to the first logic state.

In some examples, the device 800 includes a battery instead of, or in addition to, the capacitor 870. The comparison circuit 805 can be used to monitor charging of the battery, and the logic circuit 825 can be used to control a battery charging circuit.

A rail-to-rail comparison circuit allows for symmetrical monitoring of the voltage on the device to be charged, even when the threshold for charging the device and the threshold for disabling charging of the device are substantially near the voltage supply rails.

ADDITIONAL NOTES

Example 1 includes subject matter (such as an apparatus) comprising an input to receive a voltage, a threshold voltage circuit configured to provide an adjustable first threshold voltage at a first output of the threshold voltage circuit and an adjustable second threshold voltage less than the first threshold voltage at a second circuit output of the threshold voltage circuit, a comparison circuit communicatively coupled to the input and the threshold voltage circuit, and an output. The comparison circuit is configured to determine when the input voltage is greater than the first voltage threshold, including when the first voltage threshold is adjusted substantially up to a high supply voltage rail, and determine when the input voltage is less than the second voltage threshold, including when the second voltage threshold is adjusted substantially down to a low supply voltage rail. The output is configured to provide a first indication when the input voltage is greater than the first voltage threshold and to provide a second indication when the input voltage is less than the second voltage threshold.

In Example 2, the subject matter of claim 1 can optionally include a comparison circuit that can include a first comparator having a differential amplifier having an N-type Metal Oxide Semiconductor (NMOS) differential transistor pair, a first comparator input coupled to the apparatus input, and a second comparator input coupled to the first output of threshold voltage circuit. The comparison circuit can also include a second comparator having a differential amplifier having a P-type Metal Oxide Semiconductor (PMOS) differential transistor pair, a first comparator input coupled to the apparatus input, and a second comparator input coupled to the second output of threshold voltage circuit.

In Example 3, the subject matter of one or any combination of Examples 1 and 2 can optionally include first and second comparators having a fold cascode circuit topology.

In Example 4, the subject matter of one or any combination of Examples 1-3 can optionally include a logic circuit communicatively coupled to the comparison circuit and the output. The logic circuit can be configured to provide, as the first indication, a first logic state at the output when the input voltage is greater than the first voltage threshold, provide, as the second indication, a second logic state at the output when the input voltage is less than the second voltage threshold, and maintain a logic state of the output when a disable input of the comparison circuit is activated.

In Example 5, the subject matter of one or any combination of Examples 1-4 can optionally include a logic circuit having a latch circuit that can store the logic state of the output when the disable input of the comparison circuit is activated.

In Example 6, the subject matter of one or any combination of Examples 1-5 can optionally include a comparison circuit having a first comparator and a second comparator where each comparator has an output coupled to a logic circuit. The output of the first comparator can be disabled to a first binary logic state and the output of the second comparator can be disabled to a second binary logic state when the disable input of the comparison circuit is activated. The logic state of the output of the logic circuit can be stored when the first and second comparators are disabled.

In Example 7, the subject matter of one or any combination of Examples 1-6 can optionally include a logic circuit having a power on reset input, and the output of the logic circuit is set to a specified logic state when the power on reset input is activated.

Example 8 can include subject matter (such as an apparatus), or can optionally be combined with the subject matter of one or any combination of Examples 1-7 to include subject matter, comprising a capacitor, a threshold voltage circuit configured to provide an adjustable first threshold voltage at a first circuit output and an adjustable second threshold voltage less than the first threshold voltage at a second circuit output, a comparison circuit communicatively coupled to the capacitor and the threshold voltage circuit and an output. The comparison circuit is configured to determine when a voltage of the capacitor is greater than the first voltage threshold, including when the first voltage threshold is adjusted substantially up to a high supply voltage rail, and determine when the capacitor voltage is less than the second voltage threshold, including when the second voltage threshold is adjusted substantially down to a low supply voltage rail. The output is configured to provide a first indication when the capacitor voltage is greater than the first voltage threshold and to provide a second indication when the capacitor voltage is less than the second voltage threshold.

In Example 9, the subject matter of Example 8 can optionally include a logic circuit communicatively coupled to the comparison circuit and the output. The logic circuit can be configured to provide, as the first indication, a first logic state at the output when the capacitor voltage is greater than the first voltage threshold, and provide, as the second indication, a second logic state at the output when the capacitor voltage is less than the second voltage threshold.

In Example 10, the subject matter of one or any combination of Examples 8 and 9 can optionally include a capacitor charging circuit communicatively coupled to the logic circuit. The capacitor charging circuit can be configured to initiate charging of the capacitor when the output transitions to the second logic state and disable charging of the capacitor when the output transitions to the first logic state.

In Example 11, the subject matter of one or any combination of Examples 8-10 can optionally include a logic circuit having a latch circuit to store a logic state of the output when a disable input of the comparison circuit is activated.

In Example 12, the subject matter of one or any combination of Examples 8-11 can optionally include a logic circuit having a power on reset input. The output of the latch circuit can be set to a specified logic state when the power on reset input is activated.

In Example 13, the subject matter of one or any combination of Examples 8-12 can optionally include a comparison circuit having a first comparator and a second comparator, and each comparator has an output coupled to the logic circuit. The output of the first comparator can be disabled to a first binary logic state and the output of the second comparator can be disabled to a second binary logic state different from the first binary logic state when the disable input of the comparison circuit is activated. A latch circuit can store the logic state of the output of the logic circuit when the first and second comparators are disabled.

In Example 14, the subject matter of one or any combination of Examples 8-13 can optionally include a comparison circuit having a first comparator and a second comparator. The first comparator can include a differential amplifier having an N-type Metal Oxide Semiconductor (NMOS) differential transistor pair, a first comparator input coupled to the apparatus input, and a second comparator input coupled to the first output of threshold voltage circuit. The second comparator can include a differential amplifier having a P-type Metal Oxide Semiconductor (PMOS) differential transistor pair, a first comparator input coupled to the apparatus input, and a second comparator input coupled to the second output of threshold voltage circuit.

Example 15 can include subject matter (such as a method, a means for performing acts, or a machine-readable medium including instructions that, when performed by the machine, cause the machine to perform acts), or can optionally be combined with the subject matter of one or any combination of Examples 1-14 to include subject matter, comprising receiving a voltage at an input to an electronic circuit, generating a first circuit indication when the input voltage is greater than an adjustable first voltage threshold, including generating the first circuit indication when the first voltage threshold is adjusted substantially up to a high supply voltage rail, and generating a second circuit indication when the input voltage is less than an adjustable second voltage threshold, including generating the second circuit indication when the second voltage threshold is adjusted substantially down to a low supply voltage rail, wherein the second threshold voltage is less than the first threshold voltage.

In Example 16, the subject matter of Example 15 can optionally include generating the first indication by changing an output of the circuit to a first logic state and generating the second indication includes changing the circuit output to a second logic state, respectively, and maintaining the state of the output when the circuit is disabled.

In Example 17, the subject matter of one or any combination of Examples 15 and 16 can optionally include dividing a reference voltage to generate the first and second threshold voltages.

In Example 18, the subject matter of one or any combination of Examples 15-17 can optionally include generating the first circuit indication when a comparator having an NMOS differential pair detects that the input voltage is greater than the first voltage threshold, and generating the second circuit indication when a comparator having a PMOS differential pair detects that the input voltage is greater than the second voltage threshold.

In Example 19, the subject matter of one or any combination of Examples 15-19 can optionally include receiving a voltage from a capacitor at the input, initiating charging of the capacitor when the second indication is generated, and disabling charging of the capacitor when the first indication is generated.

In Example 20, the subject matter of Example 15 can optionally include means for receiving a voltage at an input to an electronic circuit, illustrative examples of which can include an input and/or output connection to an integrated circuit (IC). The subject matter can also include means for generating a first circuit indication when the input voltage exceeds a first voltage threshold and the first voltage threshold can adjustable up to substantially a high supply voltage rail, illustrative examples of such means can include a comparison circuit and a comparator. The subject matter can further include means for generating a second circuit indication when the input voltage is less than a second voltage threshold, the second voltage threshold being adjustable down to substantially a low supply voltage rail, and the second threshold voltage is less than the first threshold voltage. Illustrative examples of such means can include a comparison circuit and a comparator.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile computer-readable media during execution or at other times. These computer-readable media can include, but are not limited to, hard disks, removable magnetic disks, removable optical disks (e.g., compact disks and digital video disks), magnetic cassettes, memory cards or sticks, random access memories (RAM's), read only memories (ROM's), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   an input to receive a voltage;
   a threshold voltage circuit configured to provide an adjustable first threshold voltage at a first output of the threshold voltage circuit and an adjustable second threshold voltage at a second output of the threshold voltage circuit, wherein the second threshold voltage is less than the first threshold voltage;
   a comparison circuit communicatively coupled to the input and the threshold voltage circuit, the comparison circuit including a first comparator and a second comparator configured to:
      determine when the input voltage is greater than the first voltage threshold, including when the first voltage threshold is adjusted to a high supply voltage rail; and
      determine when the input voltage is less than the second voltage threshold, including when the second voltage threshold is adjusted to a low supply voltage rail;
   an output of the first comparator and an output of the second comparator configured to provide a first indication when the input voltage is greater than the first voltage threshold and to provide a second indication when the input voltage is less than the second voltage threshold, wherein the output of the first comparator is disabled to a first binary logic state and the output of the second comparator is disabled to a second binary logic state when a disable input of the comparison circuit is activated; and
   a logic circuit communicatively coupled to the output of the first comparator and the output of the second comparator, wherein the logic circuit is configured to maintain a logic state of the output of the first comparator and the output of the second comparator when the disable input of the comparison circuit is activated.

2. The apparatus of claim 1, wherein the first comparator includes:
   a differential amplifier having an N-type Metal Oxide Semiconductor (NMOS) differential transistor pair;
   a first comparator input coupled to the apparatus input; and
   a second comparator input coupled to the first output of threshold voltage circuit; and wherein the second comparator includes:
   a differential amplifier having a P-type Metal Oxide Semiconductor (PMOS) differential transistor pair;
   a first comparator input coupled to the apparatus input; and
   a second comparator input coupled to the second output of threshold voltage circuit.

3. The apparatus of claim 2, wherein the first and second comparators have a fold cascode circuit topology.

4. The apparatus of claim 1, wherein the logic circuit is configured to:
   provide, as the first indication, a first logic state at the output when the input voltage is greater than the first voltage threshold; and
   provide, as the second indication, a second logic state at the output when the input voltage is less than the second voltage threshold.

5. The apparatus of claim 4, wherein the logic circuit includes a latch circuit configured to store the logic state of the output when the disable input of the comparison circuit is activated.

6. The apparatus of claim 4, wherein the logic circuit includes a power on reset input, and wherein the output of the logic circuit is set to a specified logic state when the power on reset input is activated.

7. An apparatus comprising:
   a capacitor;
   a threshold voltage circuit configured to provide an adjustable first threshold voltage at a first output of the threshold voltage circuit and an adjustable second threshold voltage at a second output of the threshold voltage circuit, wherein the second threshold voltage is less than the first threshold voltage;

a comparison circuit communicatively coupled to the capacitor and the threshold voltage circuit, the comparison circuit including a first comparator and a second comparator configured to:
  determine when a voltage of the capacitor is greater than the first voltage threshold, including when the first voltage threshold is adjusted to a high supply voltage rail; and
  determine when the capacitor voltage is less than the second voltage threshold, including when the second voltage threshold is adjusted to a low supply voltage rail; and
  an output of the first comparator and an output of the second comparator configured to provide a first indication when the capacitor voltage is greater than the first voltage threshold and to provide a second indication when the capacitor voltage is less than the second voltage threshold, wherein the output of the first comparator is disabled to a first binary logic state and the output of the second comparator is disabled to a second binary logic state when a disable input of the comparison circuit is activated; and
a logic circuit communicatively coupled to the output of the first comparator and the output of the second comparator, wherein the logic circuit is configured to maintain a logic state of the output of the first comparator and the output of the second comparator when the disable input of the comparison circuit is activated.

8. The apparatus of claim 7, wherein the first comparator includes:
  a differential amplifier having an N-type Metal Oxide Semiconductor (NMOS) differential transistor pair;
  a first comparator input coupled to the apparatus input; and
  a second comparator input coupled to the first output of threshold voltage circuit; and wherein the second comparator includes:
  a differential amplifier having a P-type Metal Oxide Semiconductor (PMOS) differential transistor pair;
  a first comparator input coupled to the apparatus input; and
  a second comparator input coupled to the second output of threshold voltage circuit.

9. The apparatus of claim 7, wherein the logic circuit is configured to:
  provide, as the first indication, a first logic state at the output when the capacitor voltage is greater than the first voltage threshold; and
  provide, as the second indication, a second logic state at the output when the capacitor voltage is less than the second voltage threshold.

10. The apparatus of claim 9, including:
a capacitor charging circuit communicatively coupled to the logic circuit,
wherein the capacitor charging circuit is configured to initiate charging of the capacitor when the output transitions to the second logic state and disable charging of the capacitor when the output transitions to the first logic state.

11. The apparatus of claim 9, wherein the logic circuit includes a latch circuit to store the logic state of the output when a disable input of the comparison circuit is activated.

12. The apparatus of claim 11, wherein the logic circuit includes a power on reset input, and wherein the output of the latch circuit is set to a specified logic state when the power on reset input is activated.

13. A method comprising:
receiving a voltage at an input to an electronic circuit;
generating a first circuit indication using an output of a first comparator and an output of a second comparator when the input voltage is greater than an adjustable first voltage threshold, including generating the first circuit indication when the first voltage threshold is adjusted to a high supply voltage rail; and
generating a second circuit indication using the output of the first comparator and the output of the second comparator when the input voltage is less than an adjustable second voltage threshold, including generating the second circuit indication when the second voltage threshold is adjusted to a low supply voltage rail, wherein the second threshold voltage is less than the first threshold voltage; and
maintaining a logic state of the output of the first comparator and the output of the second comparator when a disable input of the comparison circuit is activated, wherein the output of the first comparator is disabled to a first binary logic state and the output of the second comparator is disabled to a second binary logic state when the disable input of the comparison circuit is activated.

14. The method of claim 13,
wherein generating the first circuit indication includes changing an output of the circuit to a first logic state and generating the second circuit indication includes changing the circuit output to a second logic state, respectively.

15. The method of claim 13, including dividing a reference voltage using a voltage divider circuit to generate the first and second threshold voltages.

16. The method of claim 13,
wherein generating the first circuit indication includes generating the indication when a comparator having an NMOS differential pair detects that the input voltage is greater than the first voltage threshold, and
wherein generating the second circuit indication includes generating the indication when a comparator having a PMOS differential pair detects that the input voltage is greater than the second voltage threshold.

17. The method of claim 13,
wherein receiving a voltage at the input includes receiving a voltage from a capacitor at the input, and
wherein the method includes:
  initiating charging of the capacitor when the second indication is generated; and
  disabling charging of the capacitor when the first indication is generated.

18. An apparatus comprising:
means for receiving a voltage at an input to an electronic circuit;
wherein the first comparator and the second comparator are configured to generate a first circuit indication when the input voltage exceeds a first voltage threshold, wherein the first voltage threshold is adjustable up to substantially a high supply voltage rail, and generate a second circuit indication when the input voltage is less than a second voltage threshold, and wherein the second voltage threshold is adjustable down to substantially a low supply voltage rail, and wherein the second threshold voltage is less than the first threshold voltage; and
means for maintaining a logic state of the output of the first comparator and the output of the second comparator when a disable input of the comparison circuit is activated, wherein the output of the first comparator is disabled to a first binary logic state and the output of the second comparator is disabled to a second binary logic state when the disable input of the comparison circuit is activated.

* * * * *